(12) United States Patent
Larsen et al.

(10) Patent No.: US 7,679,139 B2
(45) Date of Patent: Mar. 16, 2010

(54) NON-PLANAR SILICON-ON-INSULATOR DEVICE THAT INCLUDES AN "AREA-EFFICIENT" BODY TIE

(75) Inventors: Bradley J. Larsen, Mound, MN (US);
Michael S. Liu, Bloomington, MN (US);
Paul S. Fechner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 209 days.

(21) Appl. No.: 11/853,611

(22) Filed: Sep. 11, 2007

(65) Prior Publication Data
US 2009/0065866 A1    Mar. 12, 2009

(51) Int. Cl.
*H01L 29/786* (2006.01)

(52) U.S. Cl. ............... 257/347; 257/349; 257/E29.275; 257/E29.28; 257/E29.281

(58) Field of Classification Search ......... 257/347–349, 257/E29.028, E29.13, E29.131, E29.052, 257/E29.264, E29.28, E29.281, E29.275
See application file for complete search history.

(56) References Cited

U.S. PATENT DOCUMENTS

| 6,353,245 | B1 | 3/2002 | Unnikrishnan | 257/347 |
| 6,498,371 | B1 | 12/2002 | Krishnan et al. | 257/351 |
| 6,583,493 | B1 | 6/2003 | Shoga | 257/565 |
| 6,653,708 | B2 | 11/2003 | Doyle | 257/499 |
| 6,953,738 | B2 * | 10/2005 | Veeraraghavan et al. | 438/479 |
| 6,975,041 | B2 | 12/2005 | Hirano et al. | 257/903 |
| 7,173,319 | B2 | 2/2007 | Iwamatsu et al. | 257/531 |
| 7,192,816 | B2 | 3/2007 | Fechner | 438/164 |
| 7,241,653 | B2 | 7/2007 | Hareland et al. | 438/199 |
| 2003/0222313 | A1 | 12/2003 | Fechner | 257/348 |
| 2006/0084211 | A1 * | 4/2006 | Yang et al. | 438/197 |
| 2006/0091463 | A1 * | 5/2006 | Donze et al. | 257/353 |
| 2006/0170066 | A1 * | 8/2006 | Mathew et al. | 257/401 |
| 2007/0257317 | A1 | 11/2007 | Fechner et al. | 257/351 |

OTHER PUBLICATIONS

Mathew et al. 2005 IEEE International Electron Devices Meeting "Inverted T Channel FET (ITFET)—Fabrication and Characteristics of Vertical-Horizontal, Thin Body Multi-Gate, Multi-Orientation Devices, ITFET SRAM Bit-cell Operation. A Novel Technology for 45nm and Beyond CMOS."
Hirano et al. 1999 IEEE International SOI conference "Bulk-Layout-Compatible 0.18um SOI-CMOS Technology Using Body-Fixed Partial Trench Isolation (PTI)".
Min et al. 2001 IEEE International SOI Conference "Partial Trench Isolated Body-tied (PTIBT) Structure for SOI Applications".
Hirano et al. Dec. 2001 IEEE Transactions on Electron Devices "Bulk-Layout-Compatible 0.18um SOI-CMOS Technology Using Body-Tied Partial-Trench Isolation (PTI)".

* cited by examiner

*Primary Examiner*—Jerome Jackson, Jr.
*Assistant Examiner*—Yu Chen
(74) *Attorney, Agent, or Firm*—Shumaker & Sieffert, P.A.

(57) ABSTRACT

Non-planar SOI devices that include an "area-efficient" body tie are disclosed. The device includes a bulk substrate, an insulator layer formed on a surface of the bulk substrate, and a silicon body formed on a surface of the insulator layer. The silicon body preferably includes (i) a non-planar channel connecting a source region and a drain region, and (ii) a body tie that is adjacent to the channel and couples the channel to a voltage potential. The device further includes a gate dielectric formed on the channel and a gate material formed on the gate dielectric.

16 Claims, 16 Drawing Sheets

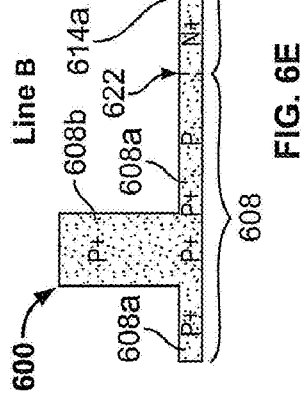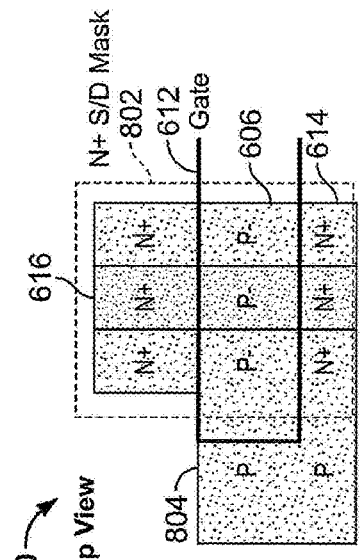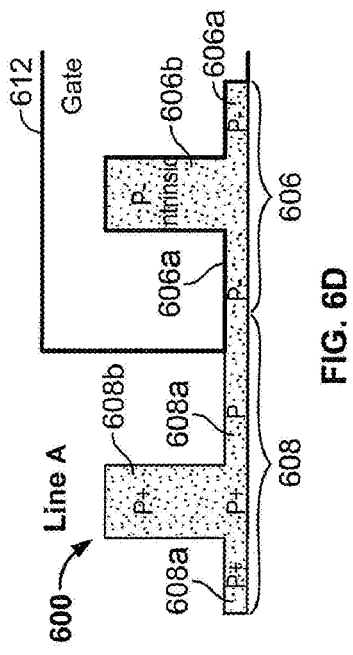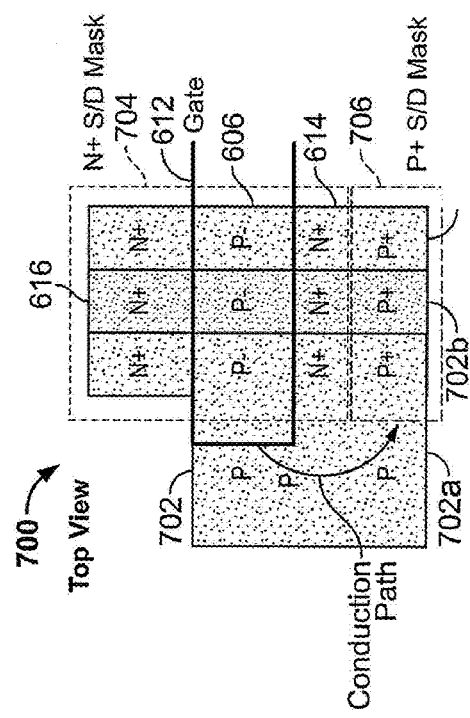

NON-PLANAR SILICON-ON-INSULATOR DEVICE THAT INCLUDES AN "AREA-EFFICIENT" BODY TIE

FIELD

The present disclosure relates generally to non-planar silicon-on-insulator devices, and more particularly, relates to non-planar silicon-on-insulator devices that include respective "area-efficient" body ties.

BACKGROUND

Over multiple generations, transistor devices (e.g., bulk, planar MOSFET devices) have been continually scaled down to smaller levels. However, the scaling of such devices has hit various roadblocks. For instance, as the source and drain regions of these devices are placed closer together, unwanted conduction may occur between the regions even when the device is turned off. This phenomenon is known as a short-channel effect.

To counter the drawbacks experienced by bulk, planar MOSFET devices, for instance, silicon-on-insulator (SOI) devices were developed SOI devices typically include a silicon substrate, a buried oxide formed on the surface of the silicon substrate, and a silicon body formed on the surface of the buried oxide. SOI devices typically show advantages over its bulk, planar MOSFET counterparts in various aspects (e.g., speed, power dissipation, latchup immunity, and reduction in process complexity and steps), particularly with short-channel-effect issues.

To further counter the drawbacks experienced by bulk, planar MOSFET devices, multi-gate devices have been introduced. Multi-gate devices typically prevent short-channel effects better than planar MOSFET devices, because multi-gate devices have greater control of the device's channel than planar MOSFET devices. In particular, a multi-gate device typically includes a non-planar channel that generally extends perpendicularly (or generally in the 112a direction as shown in FIG. 1) from the plane of the device (the plane of the device may extend in the 112b direction as shown in FIG. 1), and includes a gate that surrounds the channel on multiple sides rather than only on the top of the channel (as is the case with typical planar MOSFET devices).

The Fin-Field Effect Transistor (FinFET) device 100 is an example of such a non-planar SOI device. As shown in FIG. 1, the FinFET 100 may include a non-planar channel 106 with a gate 110 controlling the channel 106 from at least two sides, thus increasing gate control of the channel and potentially reducing short-channel effects. Further, the combination of a thin channel body and multiple gates significantly increase the mobility of the carriers in the channel.

Additionally, Inverted T Channel-Field Effect Transistor (ITFET) devices were introduced as an improvement over FinFET devices. As shown in FIG. 2, the ITFET 200 includes a non-planar channel 206 that includes a horizontal thin body 206a and vertical thin body 206b (or thin silicon region 206a and thick silicon region 206b). The horizontal thin body 206a increases the total available active region, thus providing more drive current per area in the ITFET device than typical FinFET devices. Further, the provision of the horizontal thin body 206a improves the mechanical stability of the channel 206, eliminates undercut of the buried oxide below the vertical thin body 206b, and reduces unwanted source/drain series resistances.

However, both FinFET and ITFET devices suffer drawbacks as well. For instance, in such non-planar SOI devices the channels 106 and 206 are typically left floating. When the channel of a non-planar SOI device is left floating, a floating body effect may be present. For instance, as the FinFET 100 is repeatedly turned on and off (ice, as a voltage is applied and reapplied to the gate 110), charge may accumulate in the channel 106.

This accumulated charge may cause any of a variety of adverse effects. For example, the accumulated charge may actually change the threshold voltage of the device. As another example, the accumulated charge may give rise to a history effect, meaning that the current state of the FinFET 100 at any given moment is dependent on the history of the device's biasing (i.e., dependent on how much charge has accumulated on the channel 106 as a result of the device's previous biasing).

Additionally, problems may arise from a charged particle collision (e.g., alpha particle) with the SOI device. If a charged particle collides with the channel 106, for instance, charge may accumulate in the channel 106. When the channel 106 is left floating, the charge may not (or take a relatively long time to) dissipate, and problems similar to that described above may occur.

SUMMARY

Non-planar SOI devices that include an "area-efficient" body tie are disclosed. In one embodiment, the device includes (i) a bulk substrate, (ii) an insulator layer formed on a surface of the bulk substrate, (iii) a silicon body formed on a surface of the insulator layer, the silicon body including (a) a non-planar channel connecting a source region and a drain region, and (b) a body tie that is adjacent to the channel, and couples the channel to a voltage potential, (iv) a gate dielectric formed on the channel, and (v) a gate material formed on the gate dielectric.

In some examples, the body tie includes a thin silicon region. In other examples, the body tie further includes a thick silicon region adjacent to the thin silicon region. In yet other examples, the body tie is shunted to the source regions. Preferably, the channel of the SOD device and the body tie are similarly doped.

In an example, the channel connects the source and drain regions along a first axis, and the body tie extends along a second axis. In another example, the body tie is adjacent to at least one of the source and drain regions. In other examples, the silicon body either fully depleted or partially depleted. Further, the voltage potential may be ground, or Vdd, as examples.

In another embodiment, the device includes a non-planar channel connecting a source region and a drain region, and the channel is capacitively coupled to a gate material. The device further includes a body tie that extends from the channel and couples the channel to a voltage potential.

In some examples, the body tie includes a thin silicon region and a thick silicon region adjacent to the thin silicon region. In other examples, the body tie is shunted to the source region. In yet other examples, the device is a FinFET device, or an ITFET device.

In yet another embodiment, the device includes (i) a bulk substrate, (ii) an insulator layer formed on a surface of the bulk substrate, (iii) a silicon body formed on a surface of the insulator layer, the silicon body including a first vertical fin, a second vertical fin, and a thin horizontal body connecting the first and second vertical fins, (iv) a gate dielectric formed on a portion of one of the first and second vertical fins, and on a portion of the thin horizontal body, and (v) a gate material formed on the gate dielectric.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Embodiments are described below in conjunction with the appended drawing figures, wherein like reference numerals refer to like elements in the various figures, and wherein:

FIGS. 6A, 6B, 6C, 6D, and 6E include various views of an embodiment of an improved ITFET device, according to an example;

FIG. 7 is a top view of another embodiment of an improved ITFET device, according to an example;

FIG. 8 is a top view of another embodiment of an improved ITFET device, according to an example;

DETAILED DESCRIPTION

1. Overview

Although non-planar SOI devices, such as FinFET 100 and ITFET 200, offer advantages over the traditional bulk, planar MOSFET devices, they suffer from drawbacks as well. As noted, charge may accumulate on the channel of the SOI device (whether by a floating body effect or by a charged particle colliding with the SOI device), and may turn the device on when it is supposed to be off, or temporarily change the threshold voltage of the device through charge accumulation.

Hence, it is desirable to form a body tie to the channel 106 to dissipate any accumulated charge on the channel 106 (or channel 206). However, forming body ties on such non-planar SOI devices may be problematic, because the body tie may occupy a relatively large amount of area compared to the SOI device itself. The increased occupation of area caused by the presence of the body tie may frustrate efforts to scale down such devices. As such, structures are disclosed for providing an "area-efficient" body tie to non-planar SOI devices. When a body tie is provided to such a non-planar SOI device, any accumulated charge on the channel of the SOI device will dissipate or be absorbed relatively quickly. Hence, floating body effects and other problems (e.g., problems relating to radiated environments) may be avoided.

In the following description, the improved non-planar SOI devices are depicted to be nFET devices by way of example only. Of course, one or more of the improved non-planar SOI devices may be a pFET device instead. One skilled in the art would recognize that pFET devices generally include dopings of the opposite type to that of nFET devices.

2. System Architecture a. Examples of Improved FinFET Devices

Figure 1:
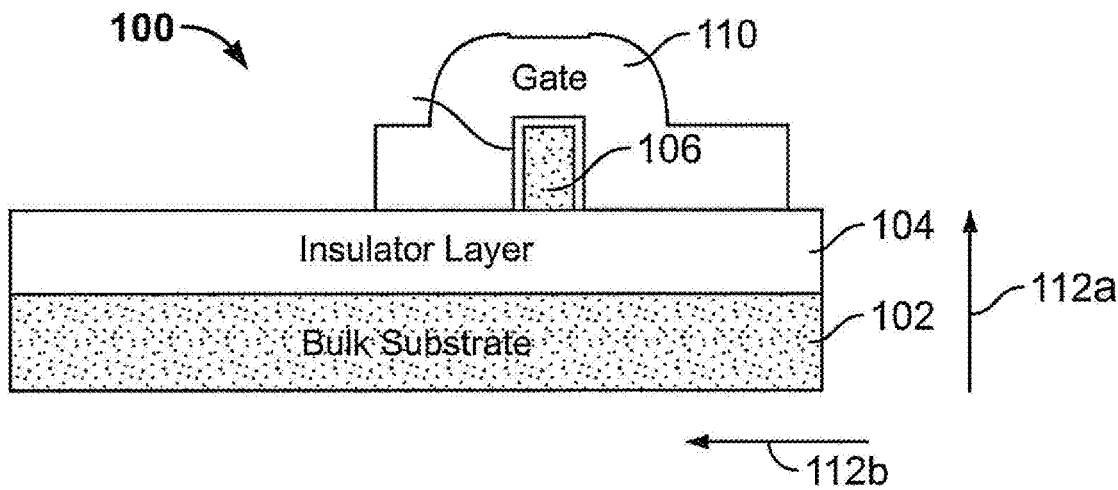
FIG. 1 is a cross-sectional view of a prior art FinFET device, according to an example.
Figure 2:
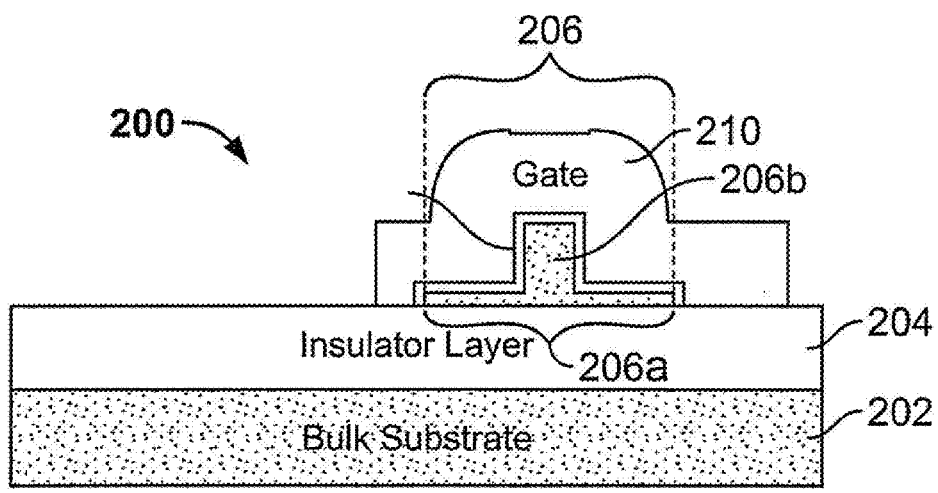
FIG. 2 is a cross-sectional view of a prior art ITFET device, according to an example.
Figure 3A:
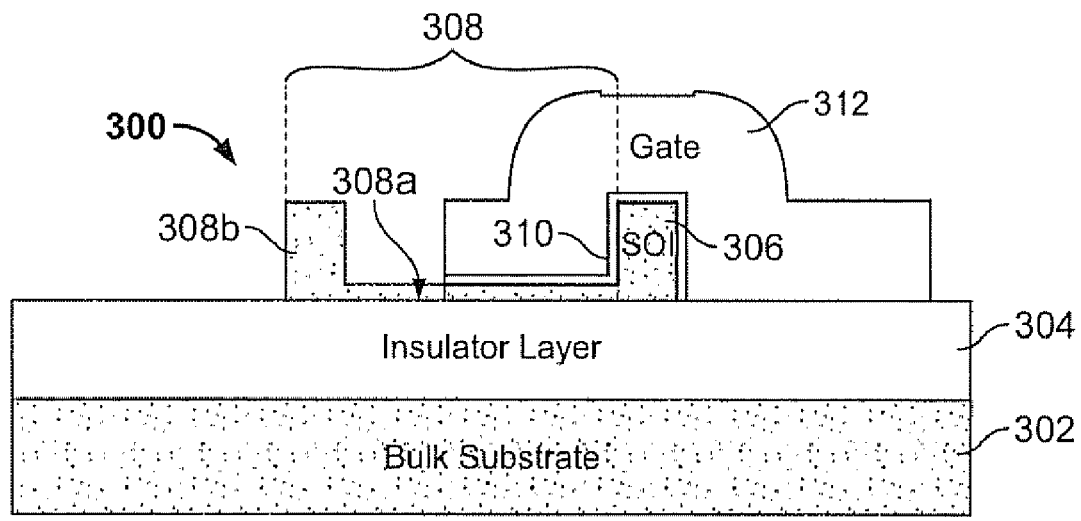
FIGS. 3A, 3B, 3C, 3D, and 3E include various views of an embodiment of an improved FinFET device, according to an example.

FIGS. 3A, 3B, 3C, 3D, and 3E include various views of an embodiment of an improved FinFET device 300 (i.e., a FinFET device that includes an "area-efficient" body tie) FIG. 3A includes a cross-sectional view of the FinFET 300, according to an example. As shown in FIG. 3A, the FinFET 300 includes a bulk substrate 302, an insulator layer 304 formed on the surface of the bulk substrate 302, a non-planar channel 306 and body tie 308 formed on the surface of the insulator layer 304, a gate dielectric 310 formed on the surface of the channel 306 and on a portion of the body tie 308, and a gate material 312 formed on the surface of the gate dielectric 310 and on a portion of the insulator layer 304.

Figure 3B:
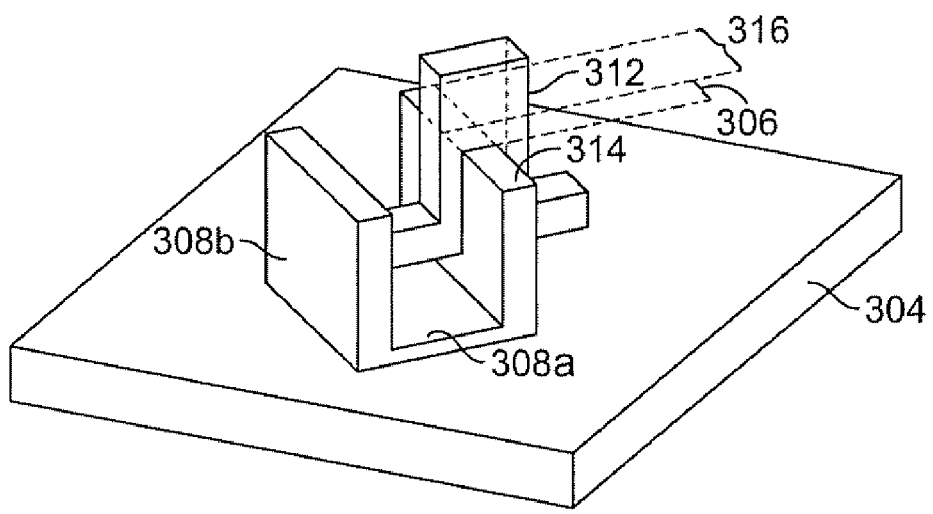

Further, FIG. 3B is a sectional view of the FinFET 300, according to an example. As shown in FIG. 3B, the FinFET 300 further includes a source region 314 and a drain region 316 that are on laterally opposite sides of the gate material 312. The source region 314 may include a thick silicon region (also known as a vertical fin), and the drain region 316 may similarly include a thick silicon region. Of course, the source 314 and drain 316 may take other sizes and shapes, and they may vary from one another as well.

The channel 306 and body tie 308 along with the source 314 and drain 316 may cooperatively define a silicon body formed on the surface of the insulator layer 304. The silicon body may either be fully or partially depleted. In FIGS. 3A and 3B, the channel 306 is shown to be generally rectangular, and include a thick silicon region, also known as a vertical fin. The channel's 306 (i.e., the thick silicon region's) vertical thickness dimension may range from 10 nm to 200 nm, and horizontal thickness dimension may range from 5 nm to 100 nm, as examples. Of course, the channel 306 may take other shapes and sizes as well.

The body tie 308 is preferably adjacent to the channel 306. However, the body tie 308 may be adjacent to other areas as well. For instance, as shown in FIG. 3B, the body tie 308 is adjacent to the channel 306 and the source 314. As other examples, the body tie 308 maybe adjacent to (or extend from) (i) the channel 306, source 314, and drain 316, (ii) channel 306 and drain 316, or (iii) the channel 306 alone. Further, the body tie 308 may be adjacent to a portion of the source 314 (and/or drain 316), or adjacent to the entirety of the source 314 (and/or drain 316).

Figure 3C:
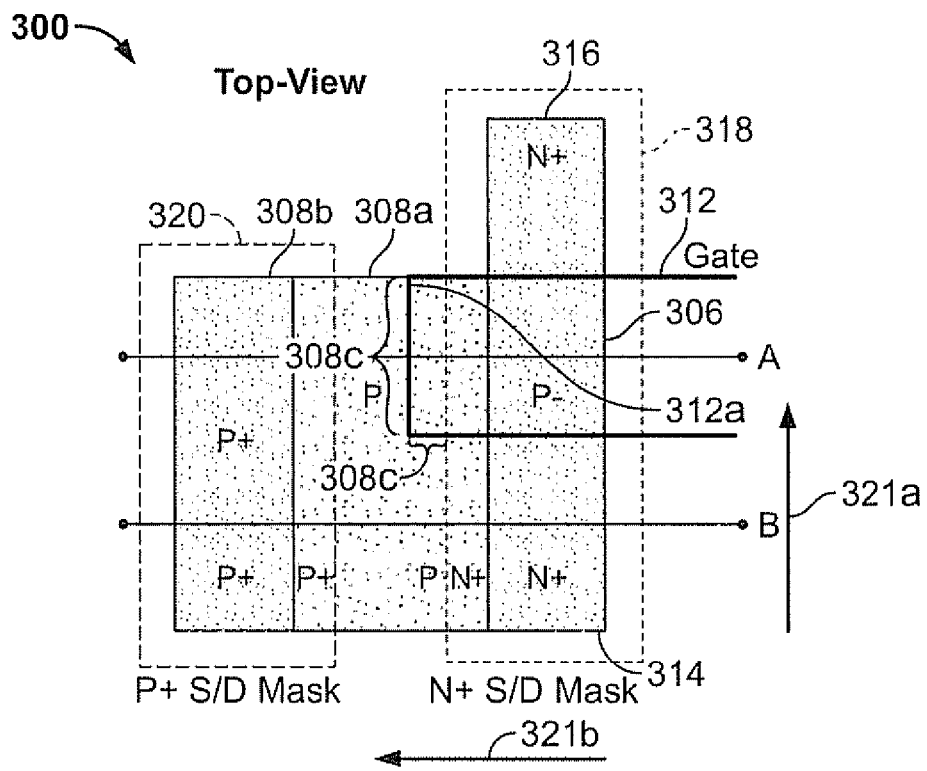

FIG. 3C is a top view of the FinFET 300. As shown in FIG. 3C, the channel 306, source 314, and drain 316 extend along a first axis 321a, and the body tie 308 extends from the channel 306 and source 314 along a second axis 321b.

The body tie 308 may take any of a variety of shapes and sizes. As depicted, the body tie 308 includes a thin silicon region 308a (also known as a thin horizontal layer) and a thick silicon region 308b (also known as a vertical fin) adjacent to the thin silicon region 308a. Alternatively, the body tie 308 may include only the thin silicon region 308a. The thin silicon region 308a and thick silicon region 308b are each shown to be generally rectangular, but each of the size and shape of the thin and thick silicon regions 308a and 308b, respectively, may vary. Further, the thick silicon region 308b is shown to be similar in size and shape to the channel 306, but the size and/or shape of the thick silicon region 308b may vary from the channel 306 as well.

The thin silicon region's 308a vertical thickness dimension may range from 5 nm to 60 nm, and horizontal thickness dimension may range from 10 nm to 1000 nm (or even greater than 1000 nm), as examples. Further, the thick silicon region's 308b vertical thickness dimension may range from 10 nm to 200 nm, and horizontal thickness dimension may range from 5 nm to 1000 nm (or even greater than 1000 nm), as examples. Of course, other examples exist for the body tie 308.

The silicon body of the FinFET 300 may be doped in any of a variety of ways. Preferably, the silicon body is doped to allow conduction between the channel 306 and body tie 308, but prevent conduction (i.e., form a diode) between the body tie 308 and each of the source 314 and drain 316. Specifically, the channel 306 and the body tie 308 are preferably similarly doped, the body tie 308 and source 314 are preferably differently doped, and the body tie 308 and drain 316 are also preferably differently doped.

By way of example, as shown in FIG. 3C, the silicon body is initially doped with or intrinsically includes a P-type dopant (denoted as "P--" to indicate a light P-type doping for this example). The gate 312, source 314, and drain 316 (and a portion of the body tie 308) are later doped with an N-type dopant (denoted as "N+" to indicate a heavy N-type doping for this example) over the area 318, and the body tie 308 is doped with a P-type dopant (denoted as "P+" to indicate a heavy P-type doping in this example) over the area 320.

Figure 3D:
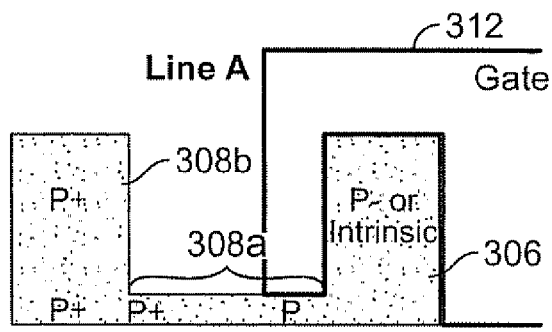
Figure 3E:
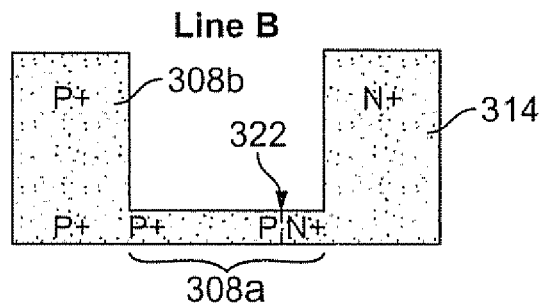

The N-type and P-type dopants may be applied in any of a variety of ways, such as with a source/drain mask and ion implantation. As shown, a heavy N-type source/drain mask is applied to the area 318 and a heavy P-type source/drain mask is applied to the area 320. Since the gate 312 covers the channel 306, the channel 306 will remain doped with a P-type dopant despite the application of the heavy N-type source/drain mask over the area 318. To further illustrate, FIG. 3D is a cross-sectional view of the FinFET 300 along the line A, and FIG. 3E is a cross-sectional view along the line B.

As depicted in FIG. 3C, the edge 312a of the gate 312 extends into the body tie 308. Preferably, the edge 312a extends past the area 318 where the heavy N-type source/drain mask is applied. This enables the portion 308c of the body tie 308 and the channel 306 to remain similarly doped and thus allow for a conduction path between the body tie 308 and channel 306. On the other hand, the body tie 308 and source 314 are differently doped (as shown by the junction 322) and thus a diode is formed between the body tie 308 and source 314. As such, substantially no conduction (except for possibly leakage current, as an example) occurs between the body tie 308 and source 314. Of course, other examples exist for doping the FinFET 300.

Since conduction occurs between the body tie 308 and channel 306, the body tie 308 is operable to couple the channel 306 to a voltage potential. The voltage potential may be ground (if the FinFET 300 is an nFET device, for instance), Vdd (if the FinFET 300 is a pFET device, for instance), or any other voltage potential (e.g., an independent voltage supply).

If the channel 306 is tied to ground via the body tie 308, any charge that may accumulate on the channel 306 such as through a capacitive charge buildup associated with a floating body effect, a charged particle colliding with the channel 306, or any other way, will dissipate relatively quickly through the ground contact via the body tie 308. Hence, a floating body effect or radiation-related effect is less likely to occur. Additionally, by dissipating any charge that may accumulate on the channel 306, the threshold voltage for the FinFET 300 may remain at a substantially constant level.

Similarly, if the channel 306 is tied to Vdd via the body tie 308, the channel 306 remains at a known voltage potential and thus a floating body effect or radiation-related effect is less likely to occur. Also similarly, the threshold voltage of the FinFET 300 remains at a substantially constant level.

Figure 4A:
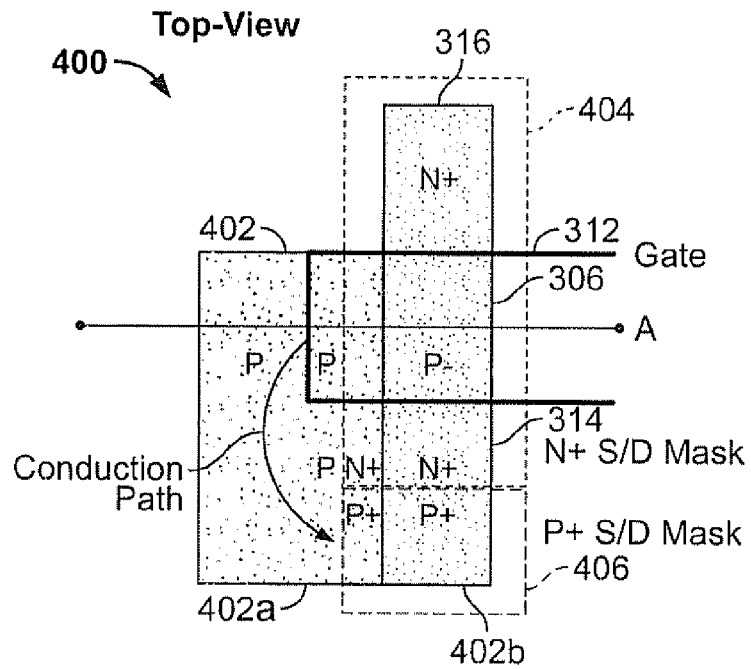
FIGS. 4A and 4B include a top view and cross-sectional view, respectively, of another embodiment of an improved FinFET device, according to an example.
Figure 4B:
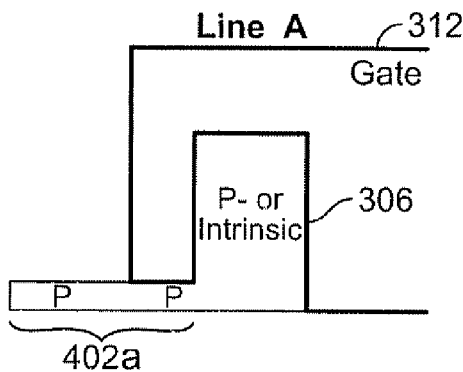

FIGS. 4A and 4B include a top view and cross-sectional view, respectively, of another embodiment of an improved FinFET device 400, according to an example. As shown in FIG. 4A, the FinFET 400 includes the channel 306, gate 312, source 314, drain 316, and body tie 402, which includes a thin silicon region 402a, and a thick silicon region 402b. By way of example, the silicon body of the FinFET 400 may initially be doped with a P-type dopant or intrinsically doped. The area 404 may later be doped with an N-type dopant, and the area 406, which defines a portion of the body tie 402, may also be doped with a P-type dopant. To further illustrate, FIG. 4B is a cross-sectional view along line A.

In this embodiment, the body tie 402 is shunted (i.e., shorted) to the source 314. The body tie 402 and source 314 may be shunted using any of a variety of materials, compounds, or elements (e.g., silicide). By shunting the body tie 402 and source 314 together, the body tie 402 and source 314 do not need separate contacts to ground or need to connect to another known voltage potential and thus only one contact to ground or other known voltage potential is necessary. Additionally, the FinFET 400 with body tie 402 is relatively easy to fabricate and may occupy less area than FinFET 300, because the thick silicon region 402b of the body tie 402 is simply an extension of the source 314 along the first axis 321a.

Figure 5:
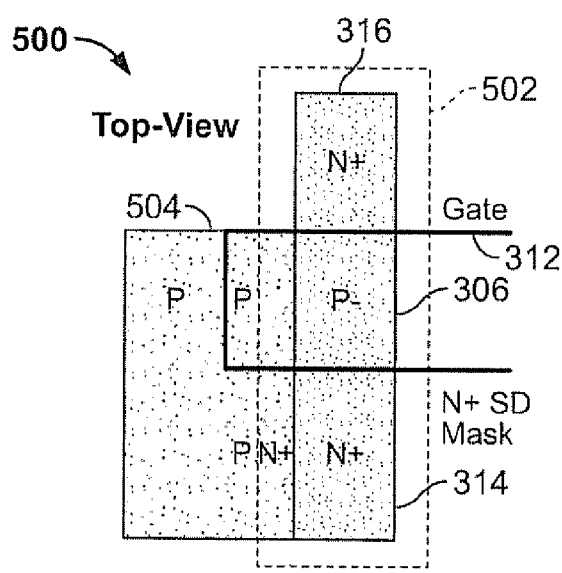
FIG. 5 is a top view of another embodiment of an improved FinFET device, according to an example.

FIG. 5 is a top view of another embodiment of an improved FinFET device 500, according to an example. The FinFET device 500 includes the channel 306, gate 312, source 314, drain 316, and body tie 504. By way of example, the silicon body of the FinFET 500 may be lightly doped with a P-type dopant or intrinsically doped, and the area 502 may later be doped with an N-type dopant. In this embodiment, the body tie 504 only includes a thin silicon region and is shunted directly to the source 314 using silicide on the thin body tie silicon region, for instance. The FinFET 500 with body tie 504 is relatively easy to fabricate and may occupy less area than FinFETs 300 and 400, because the body tie 504 does not include a thick silicon region.

b. Examples of Improved ITFET Devices

Figure 6A:
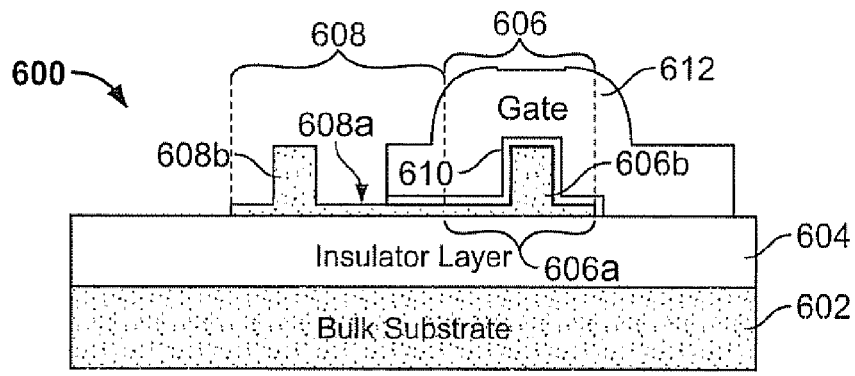

FIGS. 6A, 613, 6C, 6D, and 6E include various views of an embodiment of an improved ITFET device 600 (i.e., an ITFET device that includes an "area-efficient" body tie). FIG. 6A includes a cross-sectional view of the ITFET 600, according to an example. As shown in FIG. 6A, the ITFET 600 includes a bulk substrate 602, an insulator layer 604 formed on the surface of the bulk substrate 602, a non-planar channel 606 and body tie 608 formed on the surface of the insulator layer 604, a gate dielectric 610 formed on the surface of the channel 606 (optionally also formed on the surface of a portion of the body tie 608), and a gate material 612 formed on the surface of the gate dielectric 610 and on a portion of the insulator layer 604.

Figure 6B:
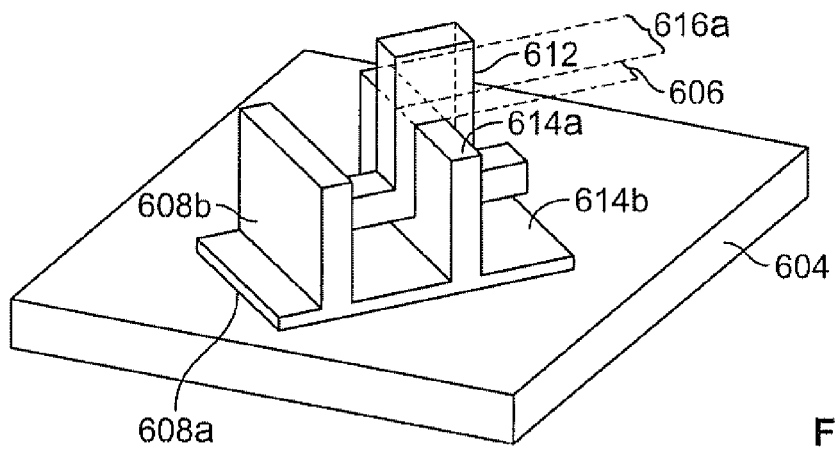

Further, FIG. 6B is a sectional view of the ITFET 600, according to an example. As shown in FIG. 6B, the ITFET 600 further includes a source region 614 and a drain region 616 that are on laterally opposite sides of the gate material 612. The source region 614 may include a thick silicon region 614a and thin silicon region 614b adjacent to the thick silicon region 614a. Similarly, the drain region 616 may include a thick silicon region 616a and thin silicon region 616b adjacent to the thick silicon region 616a. Of course, the source 614 and drain 616 may take other sizes and shapes, and they may vary from one another as well.

The channel 606 and body tie 608 along with the source 614 and drain 616 may cooperatively define a silicon body formed on the surface of the insulator layer 604. The silicon body may either be fully or partially depleted. In FIG. 6A, the channel 606 is shown to have an inverted T shape with each portion of the "T" shape being generally rectangular, and include a thick silicon region 606b (also known as a vertical fin) and a thin silicon region 606a (also known as a thin horizontal layer).

The thick silicon region's 606b vertical thickness dimension may range from 10 nm to 200 nm, and horizontal thickness dimension may range from 5 nm to 100 nm, as examples. Further, the thin silicon region's 606a vertical thickness dimension may range from 5 nm to 60 nm, and horizontal thickness dimension may range from 5 nm to 1000 nm (or even greater than 1000 nm), as examples. Of course, the channel 606 may take other shapes and sizes as well.

The body tie 608 is preferably adjacent to the channel 606. However, the body tie 608 may be adjacent to other areas as well. For instance, as shown in FIG. 6B, the body tie 608 is adjacent to the channel 606 and the source 614 (in particular, the thin silicon region 614b of the source 614). As other examples, the body tie 608 may be adjacent to or extend from (i) the channel 606, source 614, and drain 616, (ii) the channel 606 and drain 616, or (iii) the channel 606 alone. Further, the body tie 608 may be adjacent to a portion of the source 614 and/or drain 616, or adjacent to the entirety of the source 614 and/or drain 616.

The body tie 608 is preferably adjacent to the channel 606. However, the body tie 608 may be adjacent to other areas as well. For instance, as shown in FIG. 6B, the body tie 608 is adjacent to the channel 606 and the source 614 (in particular, the thin silicon region 614b of the source 614). As other examples, the body tie 608 may be adjacent to or extend from (i) the channel 606, source 614, and drain 616, (ii) the channel 606 and drain 616, or (iii) the channel 606 alone. Further, the body tie 608 may be adjacent to a portion of the source 614 and/or drain 616, or adjacent to the entirety of the source 614 and/or drain 616

Figure 6C:
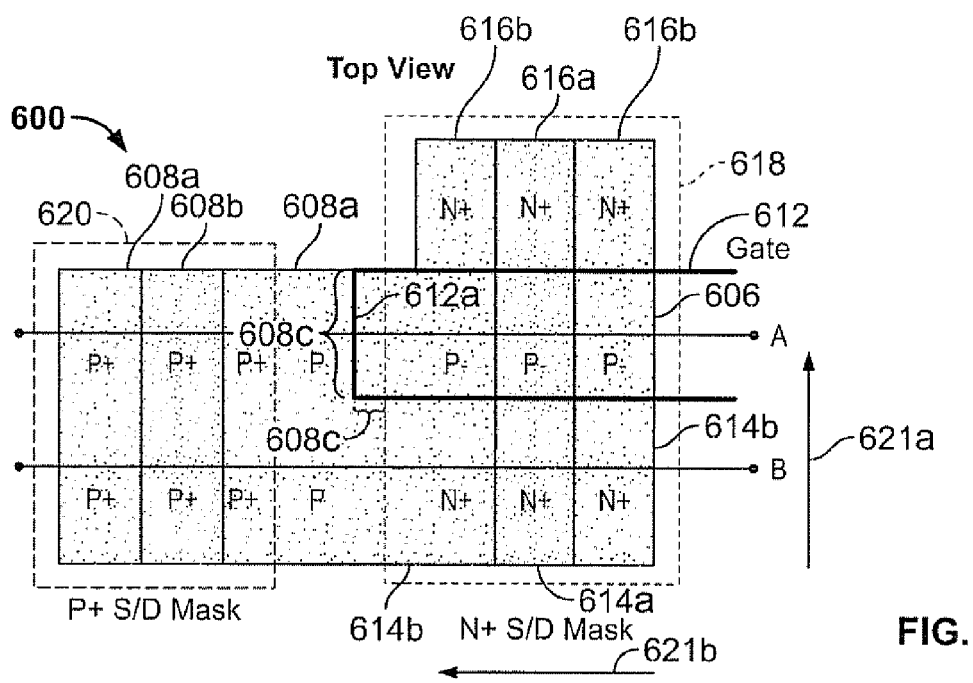

FIG. 6C is a top view of the ITFET 600. As shown in FIG. 6C, the channel 606, source 614, and drain 616 extend along a first axis 621a, and the body tie 608 extends from the channel 606 and source 614 along a second axis 621b.

The body tie 608 may take any of a variety of shapes and sizes. As depicted, the body tie 608 has an inverted-T shape. The inverted-T shape includes a thin silicon region 608a (also known as a thin horizontal layer) and a thick silicon region 608b (also known as a vertical fin) adjacent to the thin silicon region 608a. Alternatively, the body tie 608 may include only the thin silicon region 608a. The thin silicon region 608a and thick silicon region 608b are each shown to be generally rectangular, but each of the size and shape of the thin and thick silicon regions 608a and 608b, respectively, may vary. Further, the body tie 608 is shown to be similar in size and shape to the channel 606, but the size and/or shape of the body tie 608 may vary from the channel 606 as well.

The thin silicon region's 608a vertical thickness dimension may range from 5 nm to 60 nm, and horizontal thickness dimension may range from 5 nm to 1000 nm (or even greater than 1000 nm), as examples. Further, the thick silicon region's 608b vertical thickness dimension may range from 10 nm to 200 nm n, and horizontal thickness dimension may range from 5 nm to 1000 nm (or even greater than 1000 nm), as examples. Of course, other examples exist for the body tie 608.

The silicon body of the ITFET 600 may be doped in any of a variety of ways. Preferably, the silicon body is doped to allow conduction between the channel 606 and body tie 608, but prevent conduction (i.e., form a diode) between the body tie 608 and each of the source 614 and drain 616. Specifically, the channel 606 and the body tie 608 are preferably similarly doped, the body tie 608 and source 614 are preferably differently doped, and the body tie 608 and drain 616 are also preferably differently doped.

By way of example, as shown in FIG. 6C, the silicon body is initially doped with a P-type dopant or intrinsically doped. The gate 612, source 614, and drain 616 (and a portion of the body tie 608) are later doped with an N-type dopant over the area 618, and the body tie 608 is doped with a P-type dopant over the area 620. As shown, a heavy N-type source/drain mask is applied to the area 618, and a heavy P-type source/drain mask is applied to the area 620. Since the gate 612 covers the channel 606, the channel 606 will remain doped with a P-type dopant despite the application of the heavy N-type source/drain mask over the area 618. To further illustrate, FIG. 6D is a cross-sectional view of the ITFET 600 along the line A, and FIG. 6E is a cross-sectional view along the line B.

As depicted in FIG. 6C, the edge 612a of the gate 612 extends into the body tie 608. Preferably, the edge 612a extends past the area 618 where the heavy N-type source/drain mask is applied. This enables the portion 608c of the body tie 608 and the channel 606 to remain similarly doped and thus allow for a conduction path between the body tie 608 and channel 606. On the other hand, the body tie 608 and source 614 are differently doped (as shown by the junction 622) and thus a diode is formed between the body tie 608 and source 614. As such, substantially no conduction (except for possibly leakage current, as an example) occurs between the body tie 608 and source 614. Of course, other examples exist for doping the ITFET 600.

Since conduction occurs between the body tie 608 and channel 606, the body tie 608 is operable to couple the channel 606 to a voltage potential. The voltage potential may be ground (if the ITFET 600 is an nFET device, for instance), Vdd (if the ITFET 600 is a pFET device, for instance), or any other voltage potential (e.g., the body tie 608 may be shunted to the source 614, which is shown in later examples).

If the channel 606 is tied to ground via the body tie 608, any charge that may accumulate on the channel 606 such as through a capacitive charge buildup associated with a floating body effect, a charged particle colliding with the channel 306, or any other way will dissipate relatively quickly through the ground contact via the body tie 608. Hence, a floating body effect or radiation-related effect is less likely to occur Additionally, by dissipating any charge that may accumulate on the channel 606, the threshold voltage for the ITFET 600 may remain at a substantially constant level.

Similarly, if the channel 606 is tied to Vdd (if the ITFET 600 is a pFET device, for instance) via the body tie 608, the channel 606 will remain at a known voltage potential and thus a floating body effect or radiation-related effect is less likely to occur. Also similarly, the threshold voltage of the ITFET 600 remains at a substantially constant level.

FIG. 7 is a top view of another embodiment of an improved ITFET device 700, according to an example. As shown in FIG. 7, the ITFET 700 includes the channel 606, gate 612, source 614, drain 616, and body tie 702, which includes a thin silicon region 702a, and a thick silicon region 702b. By way of example, the silicon body of the ITFET 700 may be initially doped with or intrinsically include a P-type dopant. The area 704 may later be doped with an N-type dopant, and the area 706, which defines a portion of the body tie 702, may also be doped with a P-type dopant.

In this embodiment, the body tie 702 is shunted (i.e., shorted) to the source 614 at the adjacent edges of 702b and 614. The body tie 702 and source 614 may be shunted using any of a variety of materials, compounds, or elements (e.g., silicide). By shunting the body tie 702 and source 614 together, the body tie 702 and source 612 do not need separate contacts to ground or need to connect to another known voltage potential and thus only one contact to ground or known voltage potential is necessary. Additionally, the ITFET 700 with body tie 702 is relatively easy to fabricate and may occupy less area than ITFET 600, because the thick silicon region 702b and portions of the thin silicon region 702a of the body tie 702 are simply an extension of the source 614 along the first axis 621a.

FIG. 8 is a top view of another embodiment of an improved ITFET device 800, according to an example. The ITFET device 800 includes the channel 606, gate 612, source 614, drain 616, and body tie 804. By way of example, the silicon body of the ITFET 800 may be initially doped with a P-type dopant or intrinsically doped, and the area 802 may later be doped with an N-type dopant. In this embodiment, the body tie 804 only includes a thin silicon region and is shunted directly to the source 614 using silicide on the thin body tie silicon region, for instance. The ITFET 800 with body tie 804 is relatively easy to fabricate and may occupy less area than FinFETs 600 and 700, because the body tie 804 does not include a thick silicon region.

3. Processing Steps a. Fabrication Process of an Improved FinFET Device

Figure 9:
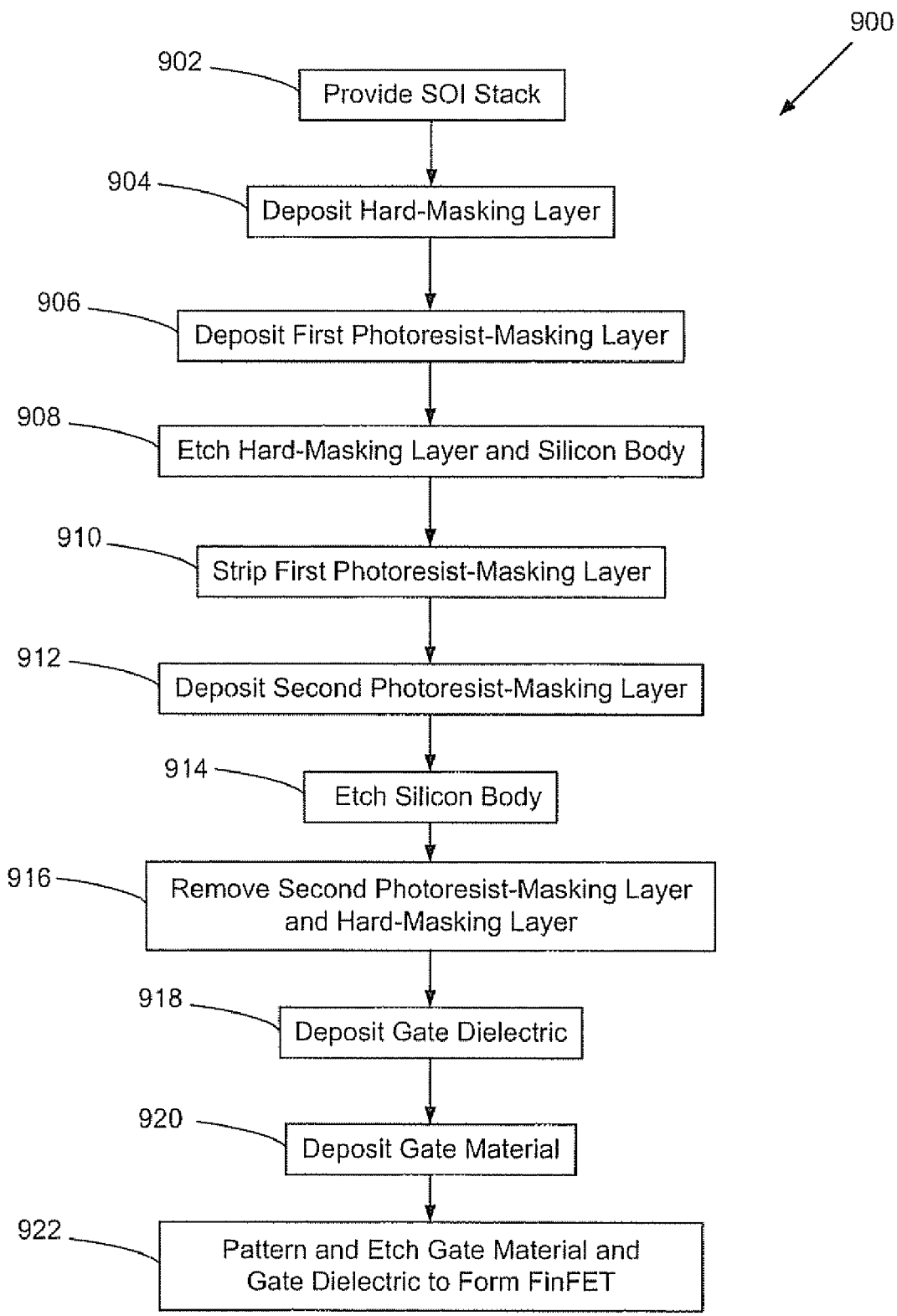
FIG. 9 is a flow chart of a method for fabricating an improved FinFET device, according to an example.

Generally, the disclosed FinFETs 300, 400, 500 and ITFETs 600, 700, 800 may be fabricated using any of a variety and combination of fabrication steps FIG. 9 is a flow chart of a method 900 of fabricating an improved FinFET 1000, according to an example. FIGS. 10A, 10B, 10C, 10D, 10E, 10F, and 10G cooperatively illustrate various processing steps used to fabricate the FinFET 1000, according to examples.

Figure 10A:
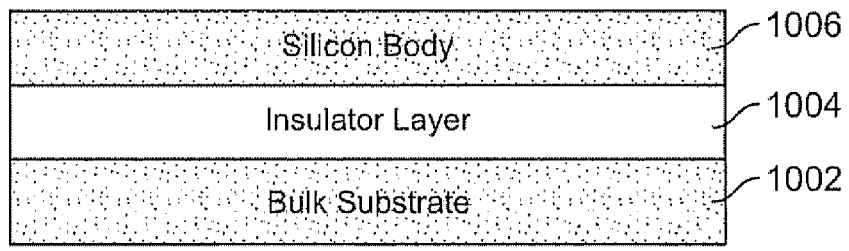
FIGS. 10A, 10B, 10C, 10D, 10E, 10F, and 10G cooperatively illustrate various processing steps used to fabricate the improved FinFET device of FIG. 9, according to examples.

At block 902 and as shown in FIG. 10A, an SOI stack 1001 is provided. The SOI stack 1001 includes a bulk substrate 1002 (e.g., single crystalline silicon), an insulator layer 1004 (e.g., silicon dioxide) formed on the surface of the bulk substrate 1002, and a silicon body 1006 (e.g., single crystalline silicon) formed on the surface of the insulator layer 1004. The silicon body 1006 may be doped with either a P-type dopant or an N-type dopant, or may be intrinsically doped. If doped, ion implantation or any other doping method may be used.

At block 904 and as shown in FIG. 101B, a hard-masking layer 1008 is deposited on the surface of the silicon body 1006. The hard-masking layer 1008 may be silicon nitride, as an example. Of course, other types of hard-masking layers, masking layers, and multi-layers more generally may be used as well.

Figure 10B:
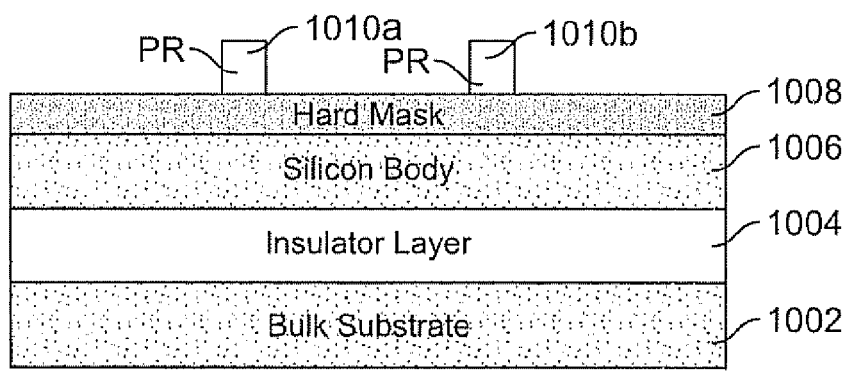

At block 906 and as shown in FIG. 10B, a photoresist-masking layer 1010 is deposited over the hard-masking layer 1008. A mask may be used to pattern the photoresist-masking layer 1010 into regions 1010a and 1010b. The photoresist-masking region 1010b may be patterned to define a channel, source, and drain for the FinFET 1000, and the photoresist-masking region 1010a may be patterned to define a portion of the body tie for the FinFET 1000. Although a hard-masking layer 1008 is shown, in some instances, the hard-masking layer 1008 is not necessary, because the photoresist may be durable enough to remain intact during the etch of the silicon body 1006.

Figure 10C:
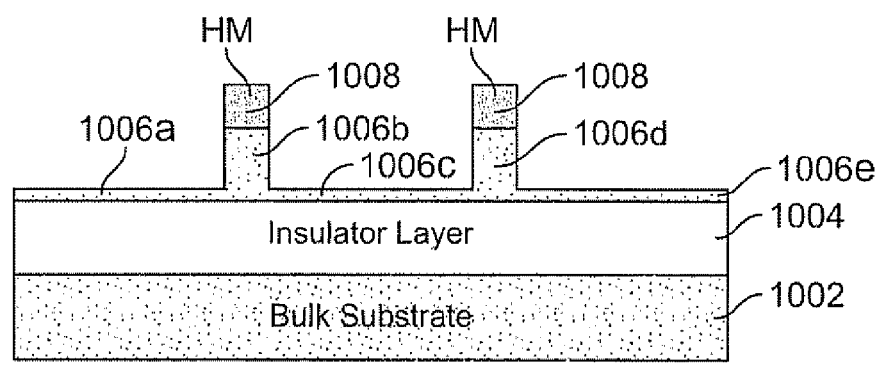

At block 908 and as shown in FIG. 10C, the hard-masking layer 1008 is etched using a wet or dry chemical etch, as examples. Further, the silicon body 1006 is etched using a wet or dry chemical etch, as examples. The etch of the hard-masking layer 1008 and silicon body 1006 may be one continuous etch step or a two-step etch process. The etch of the silicon body 1006 is preferably tailored so that a thin horizontal layer or thin silicon region remains on the surface of the insulating layer 1004. In particular, after the etch of the silicon body 1006, the etched silicon body 1006 includes thin silicon regions 1006a, 1006c, 1006e, and thick silicon regions 1006b and 1006d. At block 910 and as shown in FIG. 10C, the photoresist-masking layer 1010 is stripped away using a plasma ash and/or a wet clean, as examples.

Figure 10D:
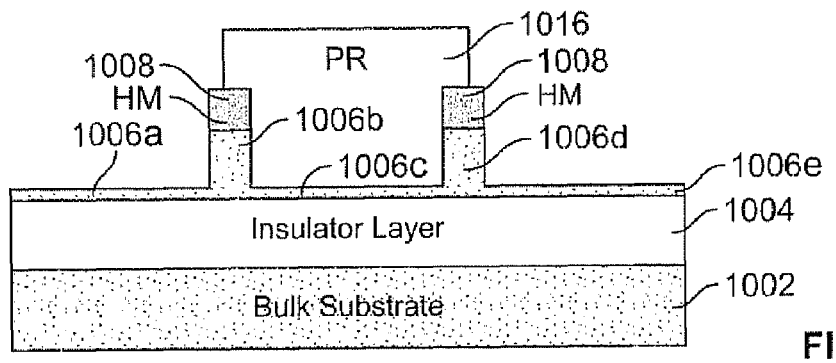

At block 912 and as shown in FIG. 10D, a photoresist-masking layer 1016 is then deposited and patterned to define a channel, source, drain, and body tie for the FinFET 1000

Figure 10E:
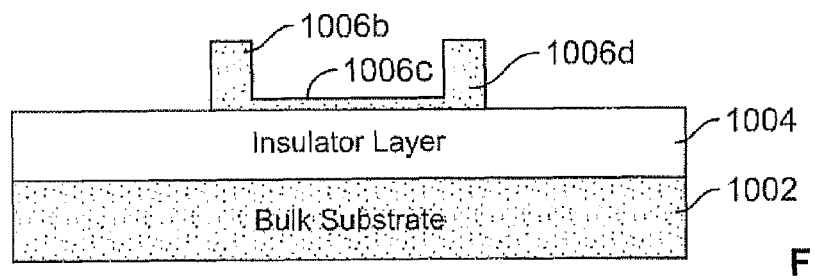

At block 914 and as shown in FIG. 10E, the thin silicon regions 1006a and 1006e as well as any portions of the silicon regions 1006b, 1006c, and 1006d not covered by the photoresist-masking layer 1016 and/or hard-masking layer 1008 are etched via a wet or dry chemical etch, as examples. At block 916 and as shown in FIG. 10E, the photoresist-masking layer 1016 and hard-masking layer 1008 are then removed. The hard-masking layer 1008 may be removed by a chemical HF (hydrofluoric acid) etch, hot phosphoric etch, or dry etch, as examples.

The remaining silicon body 1006 includes the thick silicon regions 1006b and 1006d, and the thin silicon region 1006c. The thick silicon region 1006d may define the channel, source, and drain of the FinFET 1000. The thick and thin silicon regions 1006b and 1006c, respectively, may cooperatively define the body tie for the FinFET 1000.

Figure 10F:
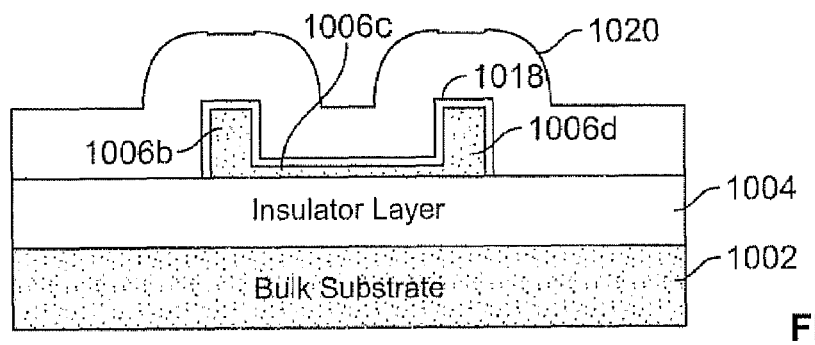

At block 918 and as shown in FIG. 10F, a gate dielectric 1018 is deposited on a portion of the thick silicon regions 1006b and 1006d and a portion of the thin silicon region 1006c. The gate dielectric 1018 may be deposited via any of a variety of deposition techniques, such as a chemical vapor deposition (CVD) or a plasma enhanced CVD (PECVD) process. Alternatively, the gate dielectric 1018 may be grown using a thermal diffusion process, for instance. At block 920 and as shown in FIG. 10F, a gate material 1020 is deposited on the gate dielectric 1018 and exposed insulator layer 1004. The gate material 1020 may be deposited using any of a variety of techniques, such as a low pressure chemical vapor deposition process.

Figure 10G:
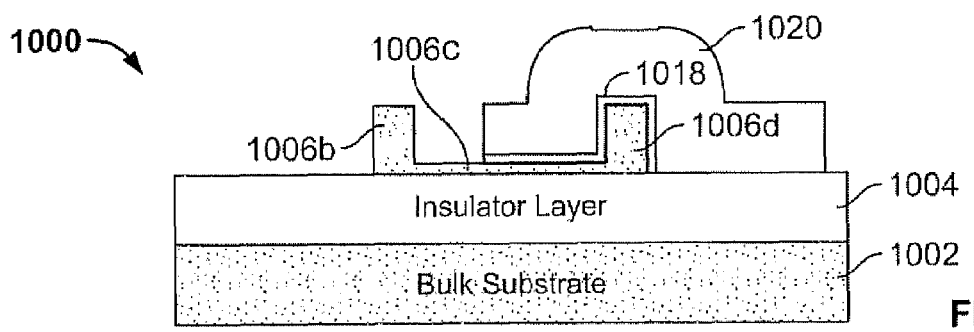

At block 922 and as shown in FIG. 10G, the gate material 1020 and gate dielectric 1018 are then patterned and etched. The gate material 1020 may be etched using a plasma etching process, as an example. Additional fabrication steps may also be employed (e.g., field isolation, the extension of source/drain implants, the application of halo implants and/or spacers, the application of N-type and/or P-type source/drain masks, silicide blocking, and silicide formation). Of course, other examples of fabricating the FinFET 1000 also exist.

b. Fabrication Process of an Improved ITFET Device

Figure 11:
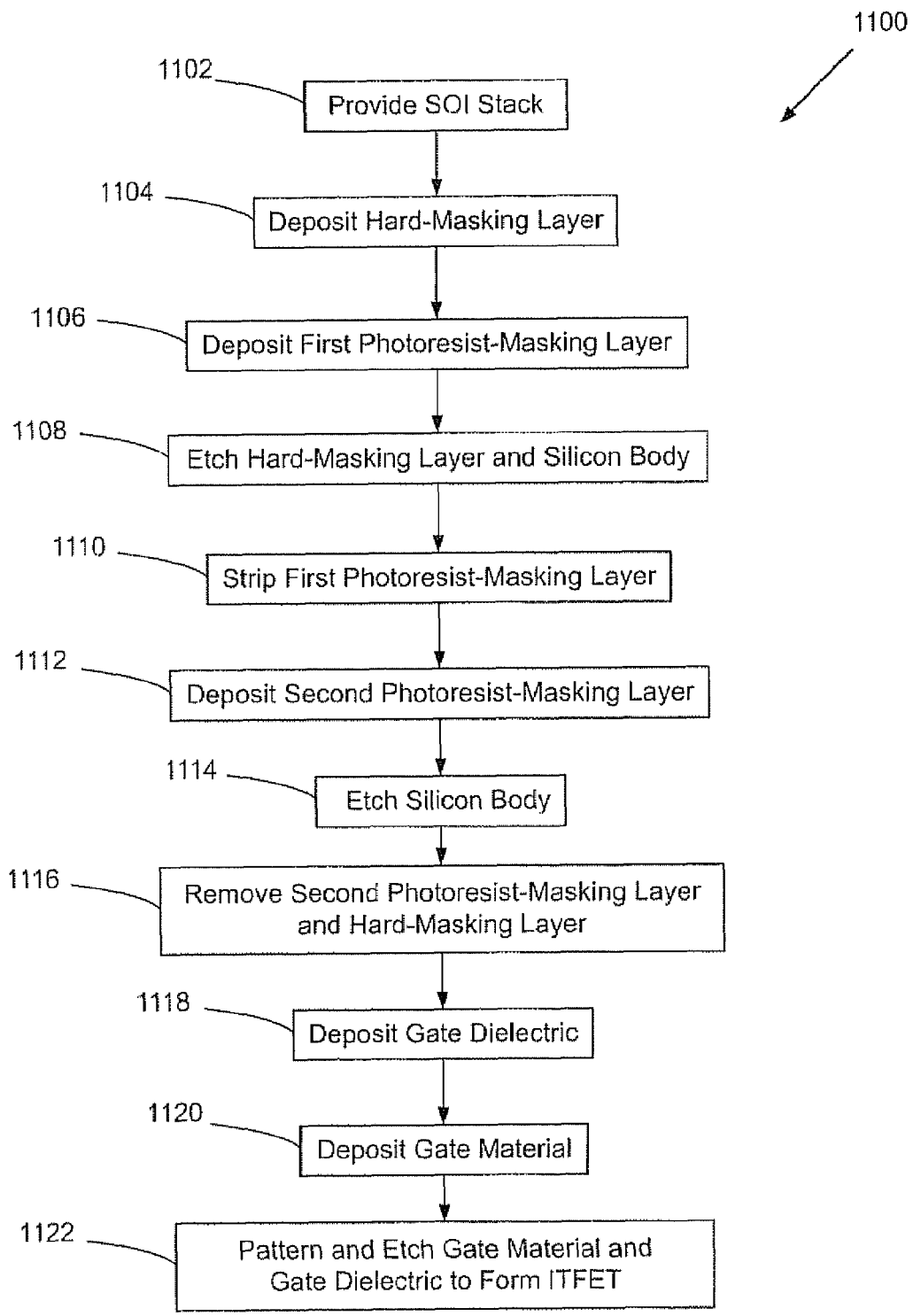
FIG. 11 is a flow chart of a method for fabricating an improved ITFET device, according to an example.

FIG. 11 is a flow chart of a method 1100 of fabricating an improved ITFET 1200, according to an example. FIGS. 12A, 12B, 12C, 12D, 12E, 12F, and 12G cooperatively illustrate various processing steps used to fabricate of the ITFET 1200, according to examples.

Figure 12A:
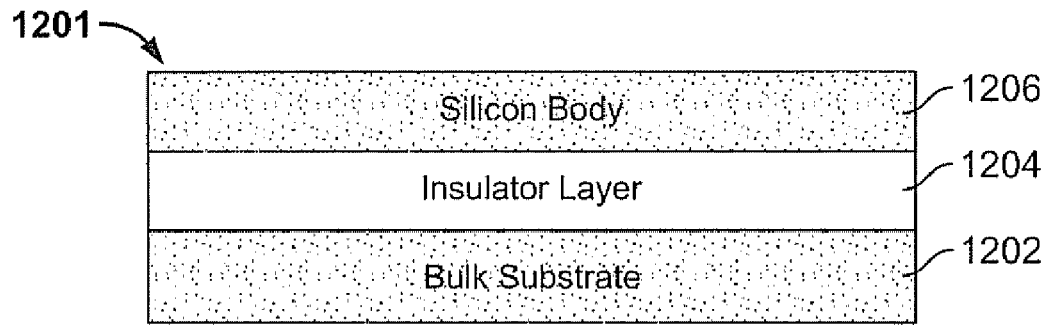
FIGS. 12A, 12B, 12C, 12D, 12E, 12F, and 12G cooperatively illustrate various processing steps used to fabricate the improved ITFET of FIG. 11, according to examples.

At block 1102 and as shown in FIG. 12A, an SOI stack 1201 is provided. The SOI stack 1201 includes a bulk substrate 1202 (e.g., single crystalline silicon), an insulator layer 1204 (edgy, silicon dioxide) formed on the surface of the bulk substrate 1202, and a silicon body 1206 (e.g., single crystalline silicon) formed on the surface of the insulator layer 1204. The silicon body 1206 may be doped with either a P-type dopant or an N-type dopant, or may be intrinsically doped. If doped, ion implantation or any other doping method may be used.

Figure 12B:
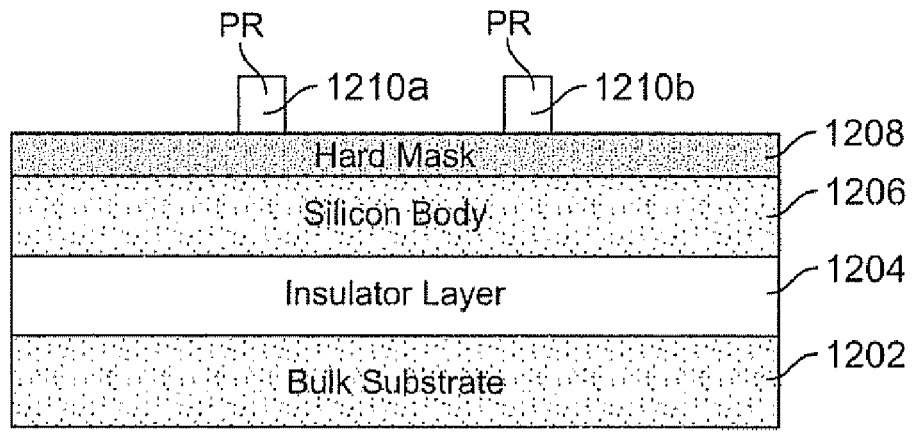

At block 1104 and as shown in FIG. 12B, a hard-masking layer 1208 is deposited on the surface of the silicon body 1206. The hard-masking layer 1208 may be silicon nitride, as an example. Of course, other, types of hard-masking layers, masking layers, and multi-layers more generally may be used as well.

At block 1106 and as shown in FIG. 12B, a photoresist-masking layer 1210 is deposited over the hard-masking layer 1208. A mask may be used to pattern the photoresist-masking layer 1210 into regions 1210a and 12100b. The photoresist-masking region 1210b may be patterned to define a source, drain, and portion of a channel for the ITFET 1200, and the photoresist-masking region 1210a may be patterned to define a portion of the body tie for the ITFET 1200.

Figure 12C:
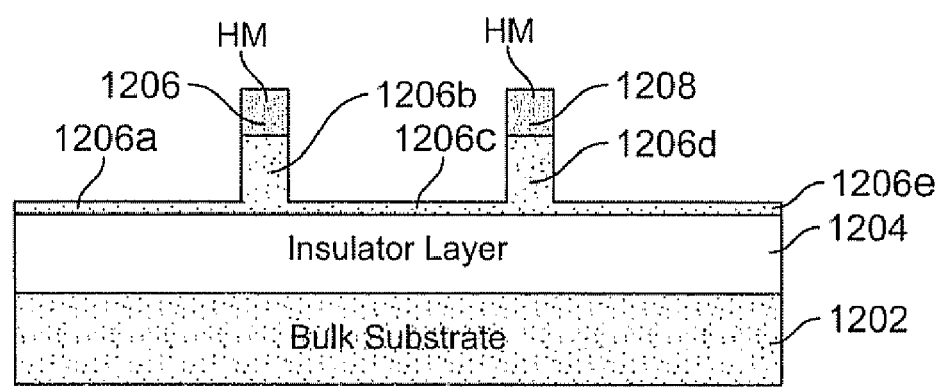
Figure 12D:
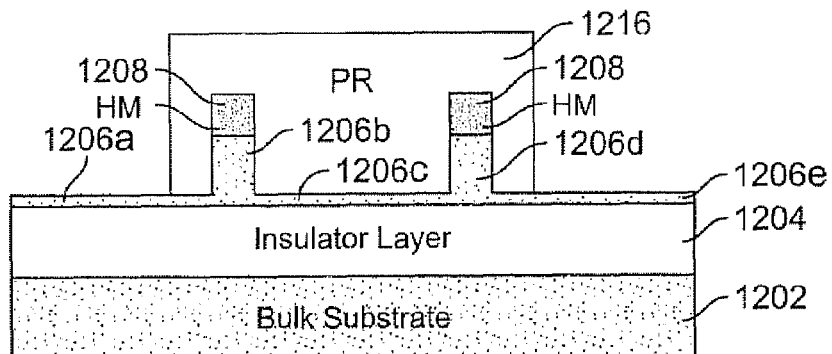

At block 1108, and as shown in FIG. 12C, the hard-masking layer 1208 is etched using a wet or dry chemical etch, as examples. Further, the silicon body 1206 is etched using a wet or dry chemical etch, as examples. The etch of the hard-masking layer 1208 and silicon body 1206 may be one continuous etch step or a two-step etch process. The etch of the silicon body 1206 is preferably tailored so that a thin horizontal layer or thin silicon region remains on the surface of the insulating layer 1204. In particular, after the etch of the silicon body 1206, the etched silicon body 1206 includes thin silicon regions 1206a, 1206c, 1206e, and thick silicon regions 1206b and 1206d. At block 1110 and as shown in FIG. 12C, the photoresist-masking layer 1210 is stripped away using a plasma ash and/or a wet clean, as examples.

At block 1112 and as shown in FIG. 12I, a photoresist-masking layer 1216 is then deposited and patterned to define a channel, source, drain, and body tie for the ITFET 1200.

Figure 12E:
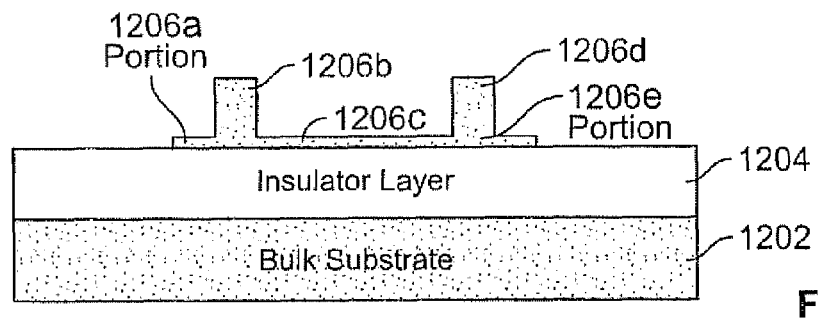

At block 1114 and as shown in FIG. 12E, portions of thin silicon regions 1206a and 1206e as well as any portions of the silicon regions 1206b, 1206c, and 1206d not covered by the photoresist-masking layer 1216 and/or hard-masking layer 1208 are etched via a wet or dry chemical etch, as examples. At block 1116 and as shown in FIG. 12E, the photoresist-masking layer 1216 and hard-masking layer 1208 are then removed. The hard-masking layer 1208 may be removed by a chemical HF (hydrofluoric acid) etch, hot phosphoric etch, or dry etch, as examples. The remaining silicon body 1206 may define the channel, source, drain, and body tie of the ITFET 1200.

Figure 12F:
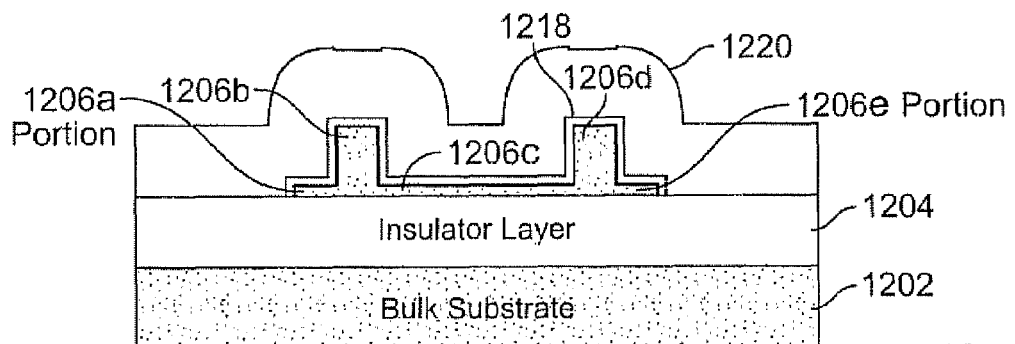

At block 1118 and as shown in FIG. 12F, a gate dielectric 1218 is deposited on a portion of the remaining silicon body 1206. The gate dielectric 1218 may be deposited via any of a variety of deposition techniques, such as a chemical vapor deposition (CVD) or a plasma enhanced CVD (PECVD) process. Alternatively, the gate dielectric 1218 may be grown using a thermal diffusion process, for instance. At block 1120 and as shown in FIG. 12F, a gate material 1220 is deposited on the gate dielectric 1218 and exposed insulator layer 1204. The gate material 1220 may be deposited using any of a variety of techniques, such as a low pressure chemical vapor deposition process.

Figure 12G:
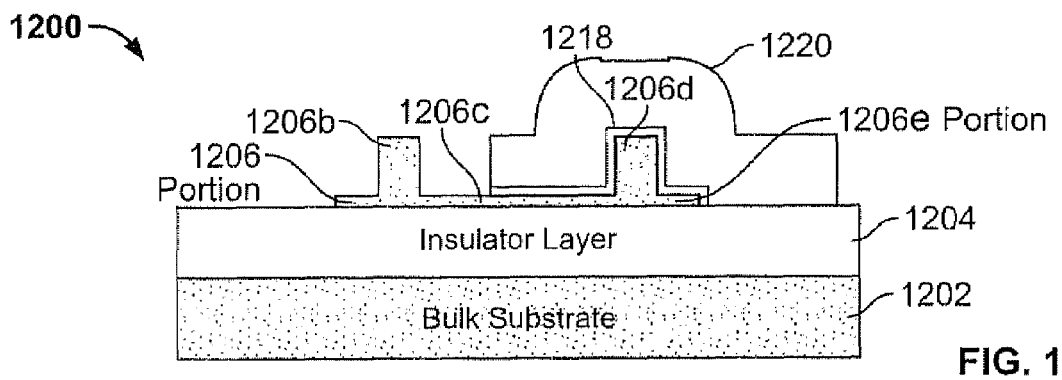

At block 1122 and as shown in FIG. 12G, the gate material 1220 and gate dielectric 1218 are then patterned and etched.

The gate material 1220 may be etched using a plasma etching process, as an example. Additional fabrication steps may also be employed (e.g., field isolation, the extension of source/drain implants, the application of halo implants and/or spacers, the application of N-type and/or P-type source/drain masks, silicide blocking, and silicide formation). Of course, other examples of fabricating the ITFET 1200 also exist.

c. Another Fabrication Process of an Improved ITFET Device

Figure 13:
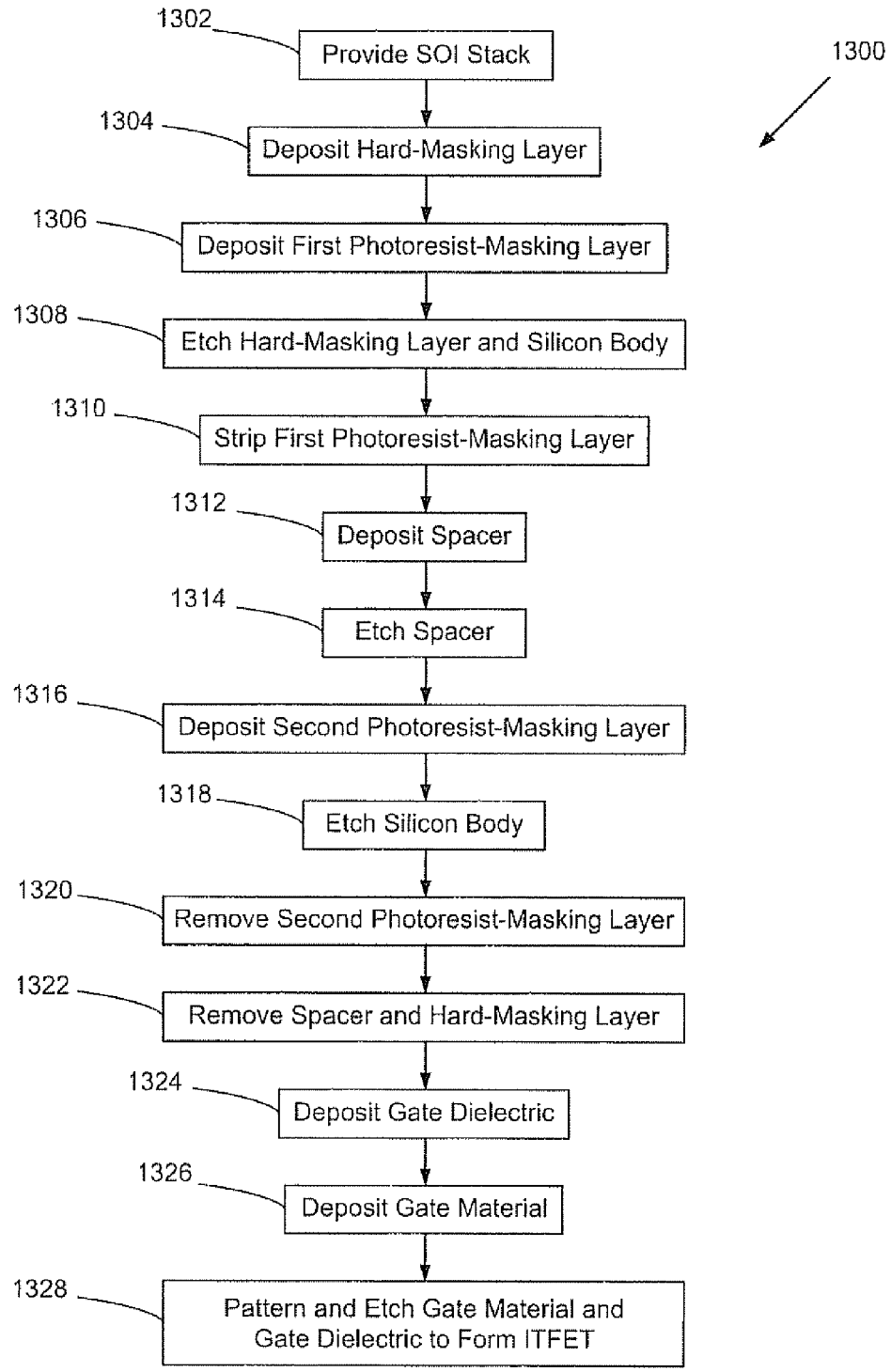
FIG. 13 is a flow chart of a method for fabricating an improved ITFET device, according to an example.

FIG. 13 is a flow chart of a method 1300 of fabricating an improved ITFET 1400, according to an example FIGS. 14A, 14B, 14C, 14D, 14E, 14F, 14G, 14H, 14I, and 14J cooperatively illustrate various processing steps used to fabricate of the ITFET 1400, according to examples.

Figure 14A:
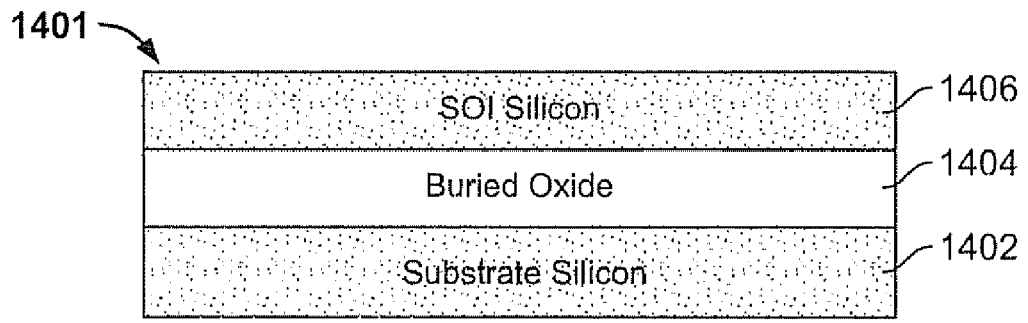
FIGS. 14A, 14B, 14C, 14D, 14E, 14F, 14G, 14H, 14I, and 14J cooperatively illustrate various processing steps used to fabricate the improved ITFET of FIG. 13, according to examples.

At block 1302 and as shown in FIG. 14A, an SOI stack 1401 is provided. The SOI stack 1401 includes a bulk substrate 1402 (erg, single crystalline silicon), an insulator layer 1404 (e.g., silicon dioxide) formed on the surface of the bulk substrate 1402, and a silicon body 1406 (e.g., single crystalline silicon) formed on the surface of the insulator layer 1404. The silicon body 1406 may be doped with either a P-type dopant or an N-type dopant, or may be intrinsically doped. If doped, ion implantation or any other doping method may be used.

Figure 14B:
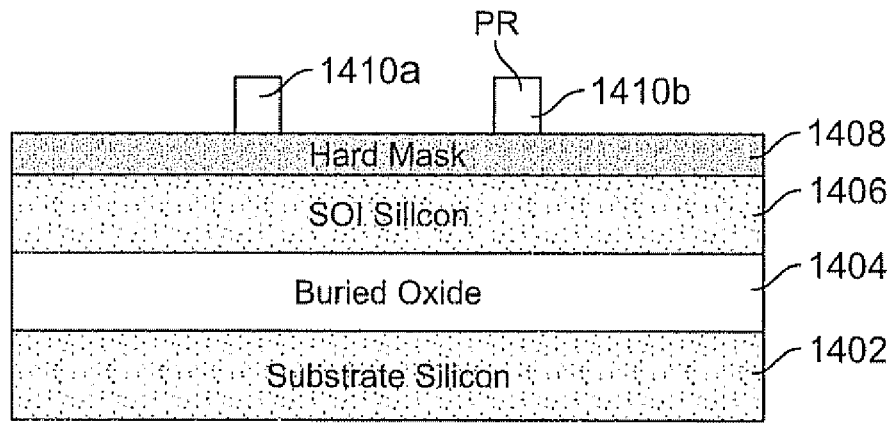

At block 1304 and as shown in FIG. 14B, a hard-masking layer 1408 is deposited on the surface of the silicon body 1406. The hard-masking layer 1408 may be silicon nitride, as an example. Of course, other types of hard-masking layers, masking layers, and multi-layers more generally may be used as well.

At block 1306 and as shown in FIG. 14B, a photoresist-masking layer 1410 is deposited over the hard-masking layer 1408. A mask may be used to pattern the photoresist-masking layer 1410 into regions 1410a and 1410b. The photoresist-masking region 1410b may be patterned to define a source, drain, and portion of a channel for the ITFET 1400, and the photoresist-masking region 1410a may be patterned to define a portion of the body tie for the ITFET 1400.

Figure 14C:
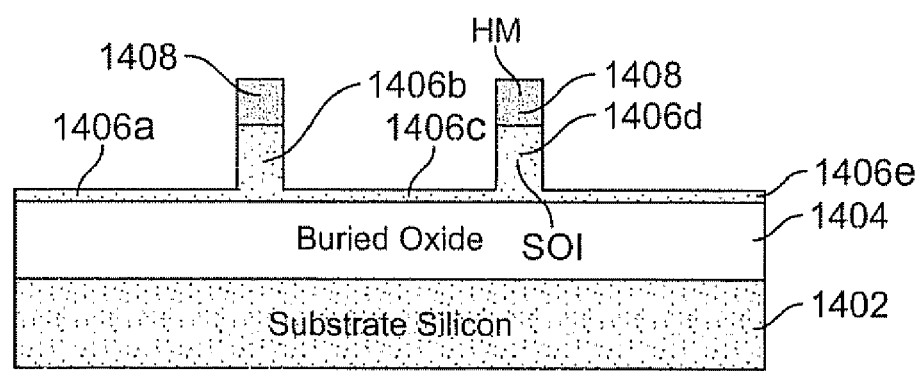

At block 1308, and as shown in FIG. 14C, the hard-masking layer 1408 is etched using a wet or dry chemical etch, as examples. Further, the silicon body 1406 is etched using a wet or dry chemical etch, as examples. The etch of the hard-masking layer 1408 and silicon body 1406 may be one continuous etch step or a two-step etch process. The etch of the silicon body 1406 is preferably tailored so that a thin horizontal layer or thin silicon region remains on the surface of the insulating layer 1404. In particular, after the etch of the silicon body 1406, the etched silicon body 1406 includes thin silicon regions 1406a, 1406c, 1406e, and thick silicon regions 1406b and 1406d. At block 1310 and as shown in FIG. 14C, the photoresist-masking layer 1410 is stripped away using a plasma ash and/or a wet clean, as examples.

Figure 14D:
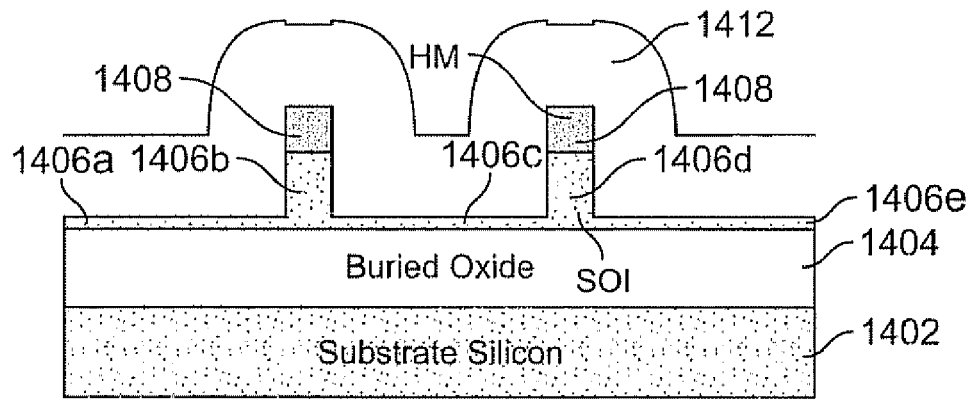

At block 1312 and as shown in FIG. 14D, a spacer 1412 is deposited oil the etched silicon body 1406. Depositing the spacer 1412 may include a conformal deposition of an oxide, nitride film, or other type of film.

Figure 14E:
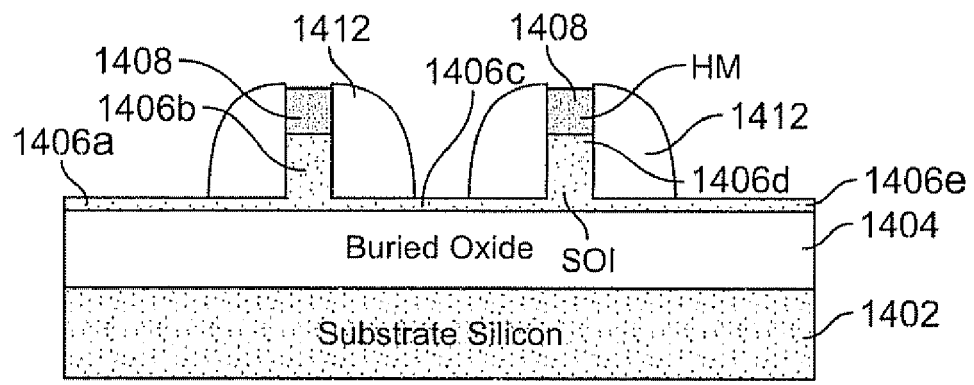

At block 1314 and as shown in FIG. 14E, the spacer 1412 is etched. In this case, a vertical etch is performed. The spacer 1412 may be etched using a reactive ion etch, as an example.

Figure 14F:
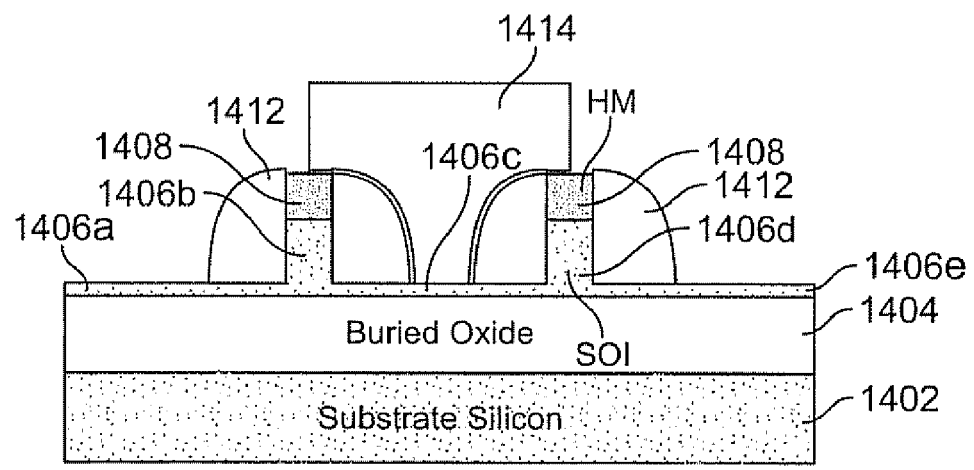

At block 1316 and as shown in FIG. 14F, a photoresist-masking layer 1414 is deposited over the etched silicon body 1406 and spacer 1412. A mask may be used to pattern the photoresist-masking layer 1414 to specifically cover a portion of the thin silicon region 1406c and spacer 1412. The presence of the spacer 1412 may provide an increased photomasking-alignment tolerance for the photoresist-masking layer 1414.

Figure 14G:
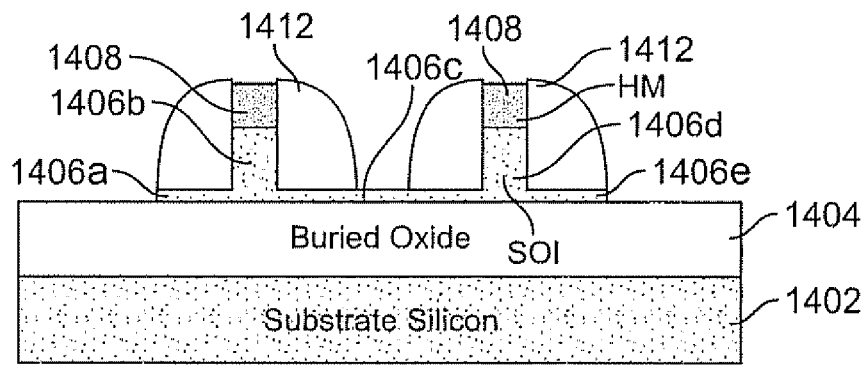

At block 1318 and as shown in FIG. 14G, portions of thin silicon regions 1406a and 1406e as well as any portions of the silicon regions 1406b, 1406c, and 1406d not covered by the photoresist-masking layer 1414 and/or spacer 1412 are etched via a wet or dry chemical etch, as examples. At block 1320 and as shown in FIG. 14O, the photoresist-masking layer 1414 is then removed.

Figure 14H:
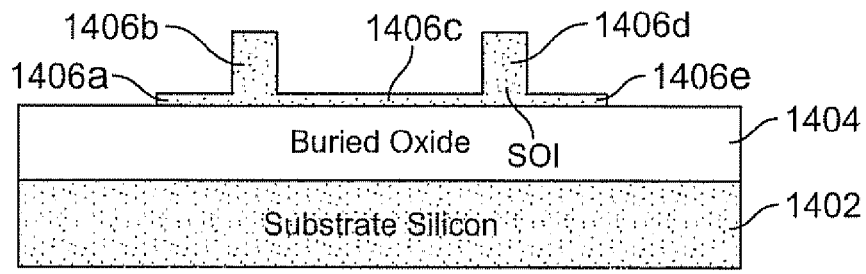

At block 1322 and as shown in FIG. 14H, the spacer 1412 and hard-masking layer 1408 are then removed. The spacer 1412 may be removed using a wet or dry chemical, as examples. The hard-masking layer 1408 may be removed by a chemical HF (hydrofluoric acid) etch, hot phosphoric etch, or dry etch, as examples. The remaining silicon body 1406 may define the channel, source, drain, and body tie of the ITFET 1400.

Figure 14I:
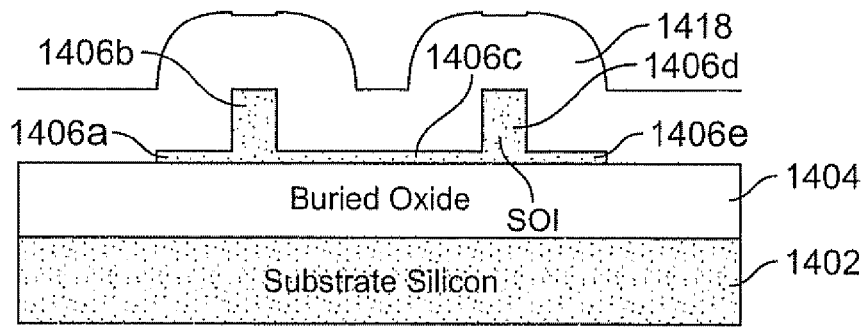

At block 1324 and as shown in FIG. 14I, a gate dielectric 1416 is deposited on a portion of the remaining silicon body 1406. The gate dielectric 1416 may be deposited via any of a variety of deposition techniques, such as a chemical vapor deposition (CVD) or a plasma enhanced CVD (PECVD) process. Alternatively, the gate dielectric 1416 may be grown using a thermal diffusion process, for instance. At block 1326 and as shown in FIG. 14I, a gate material 1418 is deposited on the gate dielectric 1416 and exposed insulator layer 1404. The gate material 1418 may be deposited using any of a variety of techniques, such as a low pressure chemical vapor deposition process.

Figure 14J:
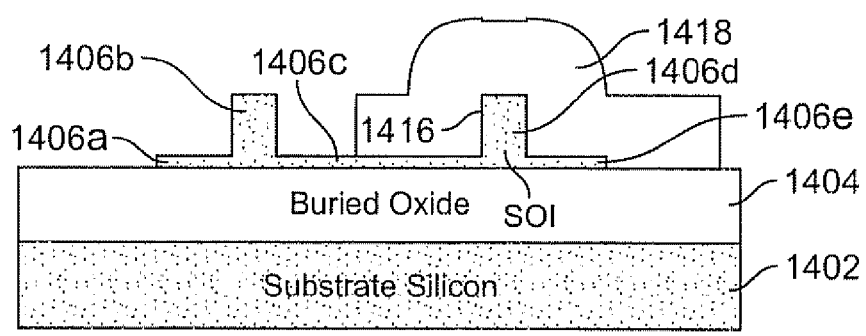

At block 1328 and as shown in FIG. 14J, the gate material 1418 and gate dielectric 1416 are then patterned and etched. The gate material 1418 may be etched using a plasma etching process, as an example. Additional fabrication steps may also be employed (e.g., field isolation, the extension of source/drain implants, the application of halo implants and/or spacers, the application of N-type and/or P-type source/drain masks, silicide blocking, and silicide formation). Of course, other examples of fabricating the ITFET 1400 also exist.

4. Conclusion

Improved non-planar SOI devices that include an "area-efficient" body tie have been disclosed. By providing an "area-efficient" body tie, the body tie does not occupy an excessive amount of area relative to the SOT device itself. Additionally, since the body tie couples the channel to a known voltage potential, any charge that may accumulate on the channel, such as through a capacitive charge buildup associated with a floating body effect, a charged particle colliding with the SOI device, or any other way, may dissipate or be absorbed by the body tie relatively quickly. Hence, a floating body effect or radiation-related problem is less likely to occur. Additionally, by dissipating or absorbing any charge that may accumulate on the channel, the threshold voltage for the improved SOI device remains at a substantially constant level.

It should be understood that the illustrated embodiments are examples only, and should not be taken as limiting the scope of the present invention. For example, a variety of semiconductor fabrication techniques, including various methods of deposition and etching, may be employed without departing from the scope of the invention itself. Further, the body tie of a particular improved SOI device may take any of a variety of shapes and sizes, and are not limited to those disclosed. Moreover, the disclosure may apply to several different types of non-planar SOI devices, and is not necessarily limited to FinFETs and ITFETs. The claims should not be read as limited to the described order or elements unless stated to that effect. Therefore, all embodiments that come within the scope and spirit of the following claims and equivalents thereto are claimed as the invention.

The invention claimed is:

1. A non-planar silicon-on-insulator (SOI) device, comprising:
   a bulk substrate;
   an insulator layer formed on a surface of the bulk substrate;
   an active region comprised of:
      a silicon body formed on a surface of the insulator layer, wherein the silicon body includes a source region and a drain region connected by a non-planar channel;
      a body tie region, wherein the body tie region physically borders the non-planar channel and at least one of the source region and drain region via a planar channel to form a junction, the planar channel comprised of a thin layer of silicon on the surface of the insulator, wherein the thin layer of silicon is less than approximately half as thick as the silicon body;
      a gate dielectric formed on the non-planar channel; and
      a gate material formed on the gate dielectric.

2. The device of claim 1, wherein the non-planar channel connects the source and drain regions along a first axis, and wherein the body tie region extends along a second axis.

3. The device of claim 1, wherein the junction between the body tie region and the at least one of the source region or drain region via the planar channel is a p-n junction.

4. The device of claim 1, wherein the body tie region further comprises a thick silicon region adjacent to the thin silicon region.

5. The device of claim 4, wherein a shape of the thick silicon region is similar to a shape of the non-planar channel.

6. The device of claim 1, wherein the gate dielectric is further formed on a portion of the body tie region.

7. The device of claim 1, wherein the non-planar channel and the body tie region are similarly doped.

8. The device of claim 1, wherein the device is a Fin-Field Effect Transistor device.

9. The device of claim 1, wherein the device is an Inverted T Channel-Field Effect Transistor device.

10. The device of claim 1, wherein the body tie region is connected to a voltage potential, the voltage potential being either one of ground or a power supply.

11. The device of claim 1, wherein the silicon body is fully depleted.

12. The device of claim 1, wherein the silicon body is partially depleted.

13. A non-planar silicon-on-insulator (SOI) device that includes a non-planar channel connecting a source region and a drain region, wherein the non-planar channel is capacitively coupled to a gate material, the device comprising:
   a planar channel comprised of a thin layer of silicon on the insulator, the planar channel physically connecting a body tie region to the non-planar channel and at least one of the source and the drain region to form a junction, wherein the thin layer is less than approximately half as thick as the body tie region.

14. The device of claim 13, wherein the body tie region includes a thin silicon region and a thick silicon region adjacent to the thin silicon regions, wherein the thin layer is less than approximately half as thick as the silicon body.

15. The device of claim 14, wherein the device is one of a Fin-Field Effect Transistor device and an Inverted T Channel-Field Effect Transistor device.

16. The device of claim 13, wherein the junction between the body tie region and at least one of the source region or drain region via the planar channel creates a p-n junction.

* * * * *

UNITED STATES PATENT AND TRADEMARK OFFICE
CERTIFICATE OF CORRECTION

PATENT NO. : 7,679,139 B2
APPLICATION NO. : 11/853611
DATED : March 16, 2010
INVENTOR(S) : Bradley J. Larsen et al.

It is certified that error appears in the above-identified patent and that said Letters Patent is hereby corrected as shown below:

Column 14, Claim 14, Line 58, thin silicon regions, wherein should be --thin silicon region, wherein--

Signed and Sealed this

Twenty-seventh Day of April, 2010

David J. Kappos
*Director of the United States Patent and Trademark Office*